US011658258B2

(12) United States Patent
Steiner

(10) Patent No.: US 11,658,258 B2
(45) Date of Patent: May 23, 2023

(54) DEVICE ARCHITECTURES HAVING ENGINEERED STRESSES

(71) Applicant: Alliance for Sustainable Energy, LLC, Golden, CO (US)

(72) Inventor: Myles Aaron Steiner, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/484,578

(22) Filed: Sep. 24, 2021

(65) Prior Publication Data

US 2022/0102578 A1 Mar. 31, 2022

Related U.S. Application Data

(60) Provisional application No. 63/083,177, filed on Sep. 25, 2020.

(51) Int. Cl.
| | |
|---|---|
| *H01L 31/0304* | (2006.01) |
| *H01L 31/0392* | (2006.01) |
| *H01L 31/0735* | (2012.01) |
| *H01L 31/18* | (2006.01) |
| *H01L 33/00* | (2010.01) |
| *H01L 33/12* | (2010.01) |
| *H01L 33/30* | (2010.01) |

(52) U.S. Cl.
CPC .... *H01L 31/1892* (2013.01); *H01L 31/03046* (2013.01); *H01L 31/0392* (2013.01); *H01L 31/0735* (2013.01); *H01L 31/1844* (2013.01); *H01L 33/0062* (2013.01); *H01L 33/0093* (2020.05); *H01L 33/12* (2013.01); *H01L 33/30* (2013.01)

(58) Field of Classification Search
CPC ........... H01L 31/1892; H01L 31/03046; H01L 31/0392; H01L 31/0735; H01L 31/1844; H01L 31/0062
See application file for complete search history.

(56) References Cited

U.S. PATENT DOCUMENTS

| | | | | |
|---|---|---|---|---|
| 2010/0310775 | A1* | 12/2010 | Bedell | H01L 31/075 427/383.3 |
| 2010/0311250 | A1* | 12/2010 | Bedell | H01L 31/074 438/759 |
| 2012/0318334 | A1* | 12/2012 | Bedell | H01L 21/304 438/460 |

(Continued)

*Primary Examiner* — Golam Mowla
(74) *Attorney, Agent, or Firm* — Michael A. McIntyre

(57) ABSTRACT

The present disclosure relates to a method that includes depositing a spalling layer onto a surface that includes a substrate, depositing a device comprising a III-V material onto the spalling layer, resulting in the forming of a stack, and dividing the stack substantially at a plane positioned within the spalling layer to form a first portion that includes the substrate and a second portion that includes the PV device, where the spalling layer includes a first layer configured to provide a compressive stress and a second layer configured to provide a tensile stress, the first layer and the second layer form an interface, the dividing occurs as result of the interface, and the compressive stress and the tensile stress are strain-balanced so that a total strain within the spalling layer is approximately zero.

20 Claims, 4 Drawing Sheets

(56) References Cited

U.S. PATENT DOCUMENTS

| | | | |
|---|---|---|---|
| 2013/0133730 A1* | 5/2013 | Pan | H01L 31/0687 |
| | | | 136/255 |
| 2015/0258769 A1* | 9/2015 | Farah | H01L 31/1892 |
| | | | 156/711 |
| 2016/0197227 A1* | 7/2016 | Forrest | H01L 21/187 |
| | | | 438/691 |
| 2016/0281247 A1 | 9/2016 | Friedman et al. | |
| 2016/0351747 A1* | 12/2016 | Forrest | H01L 31/0693 |
| 2018/0051379 A1* | 2/2018 | Deutsch | H01L 31/1868 |
| 2018/0233607 A1 | 8/2018 | Young et al. | |
| 2018/0315879 A1 | 11/2018 | Jain et al. | |
| 2018/0366325 A1* | 12/2018 | Norman | H01L 31/1852 |
| 2019/0245109 A1 | 8/2019 | Steiner et al. | |
| 2020/0115810 A1 | 4/2020 | Steiner et al. | |
| 2022/0102578 A1* | 3/2022 | Steiner | H01L 33/0093 |

* cited by examiner

DEVICE ARCHITECTURES HAVING ENGINEERED STRESSES

CROSS-REFERENCE TO RELATED APPLICATIONS

This application claims priority from U.S. Provisional Patent Application No. 63/083,177 filed on Sep. 25, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Removing and reusing expensive substrates used in the manufacture of electronic devices is a key driver toward reducing the overall cost of III-Vs for terrestrial applications. Thus, there remains a need for improved methods for manufacturing such devices that enable the recovery and reuse of substrates.

SUMMARY

An aspect of the present disclosure is a method that includes depositing a spalling layer onto a surface that includes a substrate, depositing a device comprising a III-V material onto the spalling layer, resulting in the forming of a stack, and dividing the stack substantially at a plane positioned within the spalling layer to form a first portion that includes the substrate and a second portion that includes the PV device, where the spalling layer includes a first layer configured to provide a compressive stress and a second layer configured to provide a tensile stress, the first layer and the second layer form an interface, the dividing occurs as result of the interface, and the compressive stress and the tensile stress are strain-balanced so that a total strain within the spalling layer is approximately zero. In some embodiments of the present disclosure, the dividing may be performed by exposing the full stack to a method that includes at least one of a stress and/or a force.

In some embodiments of the present disclosure, the force may include a mechanical force. In some embodiments of the present disclosure, the stress may be induced by depositing a strained material on the stack. In some embodiments of the present disclosure, the compressive stress may be between about zero MPa and about 1000 MPa. In some embodiments of the present disclosure, the compressive stress may be between about zero MPa and about 300 MPa. In some embodiments of the present disclosure, the tensile stress may be between about −1000 MPa and about zero MPa. In some embodiments of the present disclosure, the tensile stress may be between about −300 MPa and about zero MPa. In some embodiments of the present disclosure, the first layer and the second layer may form a first pair of layers, such that the stack includes a plurality of pairs of layers, where the pairs are positioned in sequence and adjacent to neighboring pairs. In some embodiments of the present disclosure, the number of pairs may be between 2 and 20, inclusively.

In some embodiments of the present disclosure, each pair may further include a third layer configured to provide a tensile stress, where the first layer is positioned between the second layer and the third layer, resulting in a triplet of layers. In some embodiments of the present disclosure, the first layer may include at least one of GaInAs and/or GaInAsP. In some embodiments of the present disclosure, the second layer may include at least one of GaAsP, GaInP, and/or GaP. In some embodiments of the present disclosure, the third layer may include at least one of GaAsP, GaInP, and/or GaP. In some embodiments of the present disclosure, the first layer may have a thickness between 2 nm and 20 nm. In some embodiments of the present disclosure, the second layer may have a thickness between 2 nm and 20 nm. In some embodiments of the present disclosure, the third layer may have a thickness between 2 nm and 20 nm.

In some embodiments of the present disclosure, the depositing of the spalling layer may be performed by a method that includes at least one of metalorganic vapor phase epitaxy, molecular beam epitaxy, hydride vapor phase epitaxy, chemical beam epitaxy, and/or liquid phase epitaxy.

An aspect of the present disclosure is a device that includes, in order, a substrate, a first temporary layer, a spalling layer, a second temporary, and a semiconductor-containing device.

In some embodiments of the present disclosure, the semiconductor-containing device may include at least one of a photovoltaic device, a light-emitting diode, a detector or sensor, and/or a display.

BRIEF DESCRIPTION OF DRAWINGS

Some embodiments are illustrated in referenced figures of the drawings. It is intended that the embodiments and figures disclosed herein are to be considered illustrative rather than limiting.

Figure 1A:
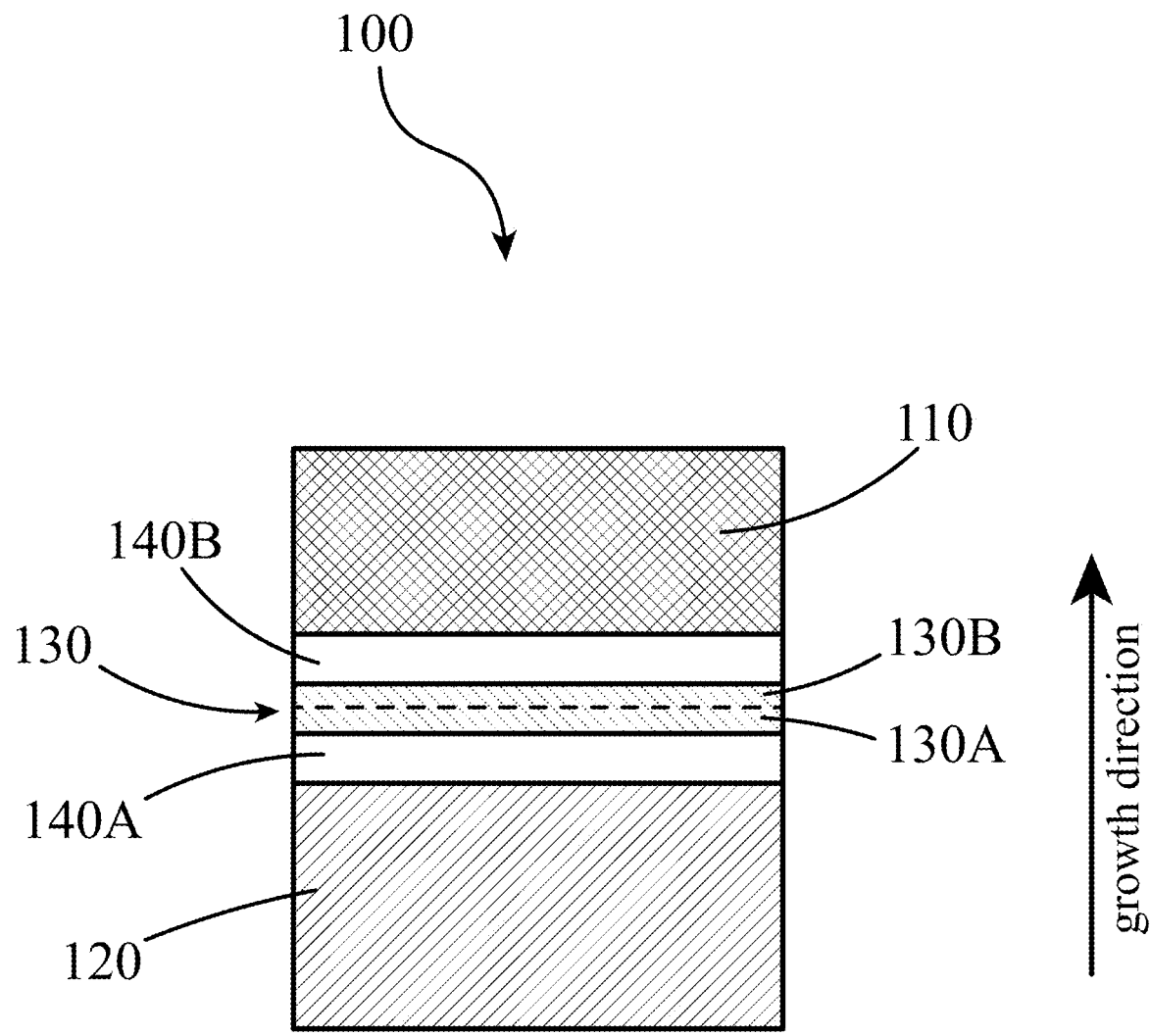
FIG. 1A illustrates a device, according to some embodiments of the present disclosure.

| REFERENCE NUMERALS | |
|---|---|
| 100 | stack |
| 110 | device |
| 120 | substrate |
| 130 | spalling layer |
| 132 | spalling triplet |
| 136 | positive spalling layer |
| 137 | negative spalling |
| 138 | fracture plane |
| 140 | temporary layer |
| 200 | method |

-continued

| REFERENCE NUMERALS | |
|---|---|
| 210 | depositing |
| 220 | dividing |
| 230 | removing |
| 240 | first portion of stack |
| 250 | second portion of stack |

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to, among other things, methods and devices for creating a weak layer in a semiconductor-containing layer to enable spalling at a prescribed depth in that layer. This enables the precise selection at a desired location (i.e., depth) at which to cause a fracture within the semiconductor-containing layer, referred to herein as a "spalling layer". Thus, the splitting of a device along a fracture to create two separate portions of the original device is referred to herein as "spalling". Among other things, these structures and methods will enable one to separate a solar cell (i.e., photovoltaic cell) or other targeted structures (e.g., light-emitting diodes, displays, etc.) from other features (e.g., a substrate) of a device having a stacked architecture without wasting material and growth time. Ultimately, this ability to separate the target device (e.g., a solar cell) from reusable features/layers of a stack that are used in the manufacturing process may enable the recycling and/or reuse of these features/layers to grow subsequent devices, e.g., on the original substrate.

FIG. 1A illustrates an exemplary device, i.e., a stack 100, designed for spalling, that includes a substrate 120 and a device 110 (e.g., a photovoltaic device) with at least three additional layers positioned between the substrate 120 and the device 110. As shown in the example of FIG. 1A, a stack 100 may include a spalling layer 130 positioned between two temporary layers, 140A and 140B, where each of the spalling layer 130, the first temporary layer 140A, and the second temporary layer 140B, are positioned between the substrate 120 and the device 110. As described below in more detail, the two temporary layers, 140A and 140B, are referred to herein as "temporary" because, after the stack 100 is spalled to create two separate portions, the temporary layers, 140A and 140B, may be removed to yield the targeted device 110 and the substrate 120, which may then be recycled and/or reused. This removal process may, among other things, provide smoother surfaces on the substrate 120 and/or the device 110, which in turn enables quicker recycle of these for use in the manufacture of additional devices. In some embodiments of the present disclosure, the device 110 of a stack 100 may include at least one of a Group III element and/or a Group V element. For example, the device 110 could be a GaAs solar cell, itself comprised of several layers of alloys including GaAs, GaInP, AlGaAs, AlInP and GaInAsN with appropriate electronic properties.

In some embodiments of the present disclosure, a spalling layer 130 may include a pair of layers, a first spalling layer 130A and a second spalling layer 130B, where each layer provides either a tensile stress or a compressive stress. The interface between the two layers (130A and 130B) of the spalling layer 130 is indicated in FIG. 1 by the dashed line. This combination of a single layer providing a tensile strength and a single layer providing a compressive strength and the interface created by placing them adjacent to one another is referred to herein as "spalling pair". The tensile and compressive stresses of the first spalling layer 130A and the second spalling layer 130B are balanced, by tuning each layer's thickness and composition, so that the average stress of the two layers (130A and 130B) of the spalling layer 130 is approximately zero. The thickness of each of the two layers (130A and 130B) will depend on, among other things, the composition of the two layers. For example, either the first spalling layer 130A or the second spalling layer 130B, in this case for illustrative purposes the first spalling layer 130A, may provide a tensile stress that is between about −1000 MPa and less than zero MPa, or between about −300 MPa and less than zero MPa, while the other layer, in this example, the second spalling layer 130B, provides a compression stress that is between greater than zero MPa and 1000 MPa, or between greater than zero MPa and about 300 MPa. As shown herein, the pair of layers (130A and 130B) used to construct a spalling layer 130 may be in physical contact with each other. Further, a spalling layer 130 may include a plurality of pairs of layers, for example between one pair and 20 pairs.

In some embodiments of the present disclosure, a layer (of a pair) of a spalling layer 130 providing a tensile stress may include at least one of GaAsP, GaInP, and/or GaP and have a thickness between 2 nm and 20 nm. In some embodiments of the present disclosure, a layer (of a pair) of a spalling layer 130 providing a compressive stress may include at least one of GaInAs or GaInAsP and have a thickness between 2 nm and 20 nm.

As described in more detail below, after fabrication of a stack 100, the stack 100 may be spalled (i.e., split) at a specific location within the spalling layer 130, resulting in a first portion of the stack containing the device 110 and a temporary layer 140B and a second portion containing the substrate 120 and a temporary layer 140A. Further, each portion may include a part of the original spalling layer 130 (see FIG. 2). Each temporary layer, 140A and/or 140B, may be constructed of materials that may be etched away (along with any remaining spalling layer 130) to yield the "clean" targeted device 110 and the "clean" recovered substrate 120. Therefore, in some embodiments of the present disclosure, a temporary layer, 140A and/or 140B, may be constructed of one or more layers that may be removed upon exposure to a liquid, gas, and/or solid; e.g., a chemical etchant.

Referring again to FIG. 1A, in some embodiments of the present disclosure, a first temporary layer 140A positioned adjacent to a substrate 120 may include a first removable layer (not shown) constructed of GaInP, where the first removable layer is positioned between the substrate 120 and the spalling layer 130. In some embodiments of the present disclosure, the first temporary layer 140A positioned adjacent to the substrate 120 may further include a second removable layer (not shown) constructed of GaAs, where the second removable layer is positioned between the first removable layer and the spalling layer 130. A second temporary layer 140B positioned adjacent to the device 110 may include a third removable layer (not shown) constructed of GaInP, where the third removable layer is positioned between the device 110 device and the spalling layer 130. In some embodiments of the present disclosure, the second temporary layer 140B positioned adjacent to the device 110 may further include a fourth removable layer (not shown) constructed of GaAs, where the fourth removable layer is positioned between the third removable layer and the spalling layer 130. In some embodiments of the present disclosure, the removable layers of a temporary layer, 140A and/or 140B, may each have a thickness between about 0.1 μm and about 1 μm.

In some embodiments of the present disclosure, a substrate 120 may be constructed of GaAs, with a thickness between about 300 μm and about 650 μm and can be doped to be either n-type or p-type. A substrate 120 may be polished on one or both sides. The orientation of the substrate may be (001), meaning that epitaxial growth takes place on the (001) crystallographic plane. Furthermore, a substrate 120 may be miscut at an angle up to about 15 degrees with respect to the (001) plane. Other substrates may be recovered and recycled using the stack architectures and methods described herein, for example substrates 120 constructed of germanium and/or InP.

Figure 1B:
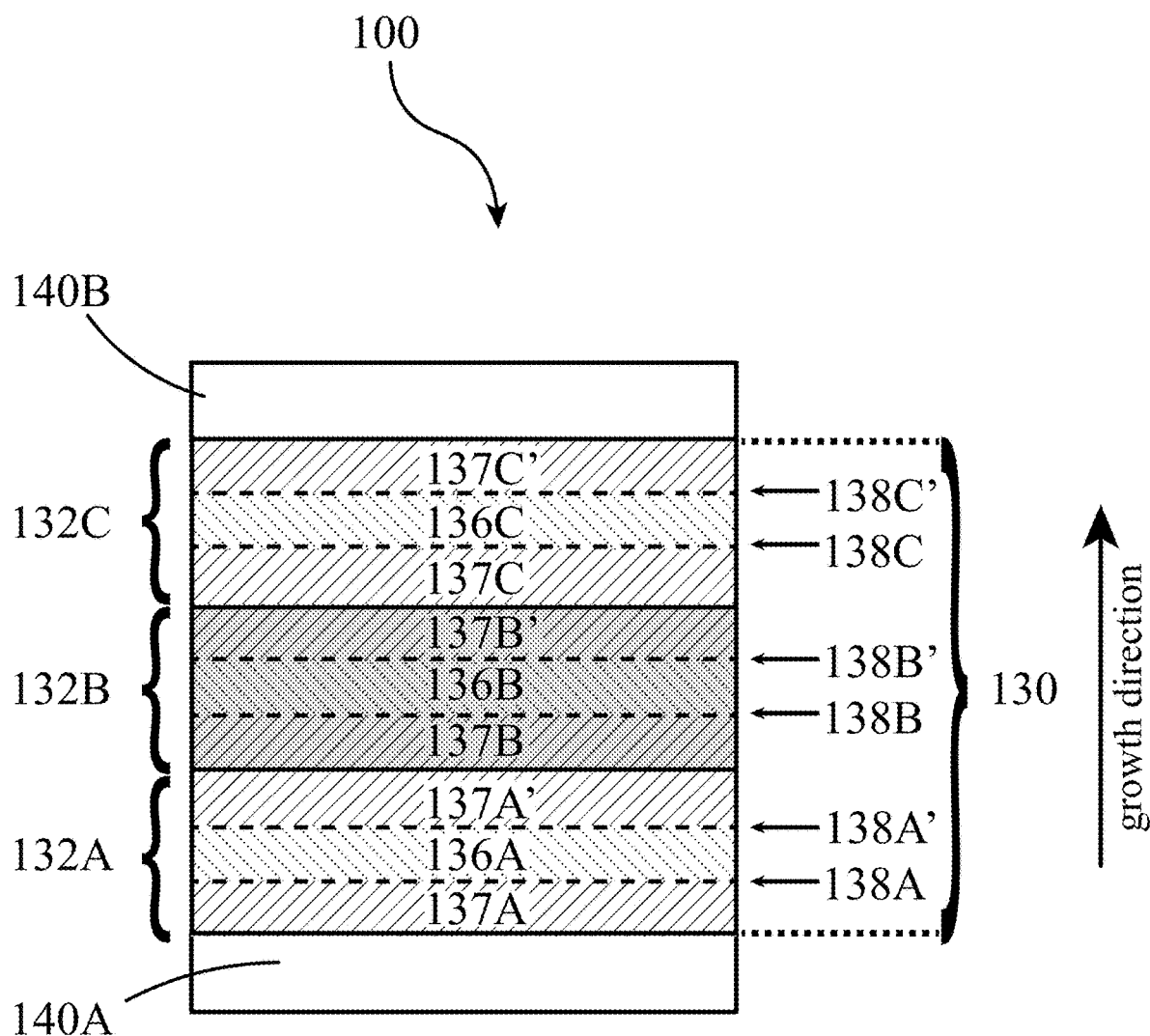
FIG. 1B illustrates a device, with focus in a spalling layer, according to some embodiments of the present disclosure.

FIG. 1B illustrates a portion of a stack 100, with a more focused view of a spalling layer 130, according to some embodiments of the present disclosure. As shown in FIG. 1A, the spalling layer 130 in FIG. 1B is positioned between two temporary layers (140A and 140B), as described above.

In this example, a spalling layer 130 is constructed of stacked groups of three individual layers. As defined herein, such a group of three layers is referred to herein as a "spalling triplet". The exemplary stack 100 shown in FIG. 1B is illustrated with three spalling triplets (132A, 132B, and 132C), although a stack 100 may be fabricated with between one spalling triplet and 20 spalling triplets. In this exemplary embodiment, each spalling triplet 132 contains a single layer that provides compressive stress positioned between two layers that provide tensile stress. As defined herein, a spalling layer that provides compressive stress is referred to herein as a "positive spalling layer" and a spalling layer that provides tensile stress is referred to herein as a "negative spalling layer".

Referring again to FIG. 1B, the exemplary spalling layer 130 is constructed of (in the order of growth), a first spalling triplet 132A constructed of a first positive spalling layer 136A positioned between a pair of negative spalling layers (137A and 137A'), a second spalling triplet 132B constructed of a first positive spalling layer 136B positioned between a pair of negative spalling layers (137B and 137B'), and a third spalling triplet 132C constructed of a first positive spalling layer 136C positioned between a pair of negative spalling layers (137C and 137C'). Without wishing to be bound by theory, in some embodiments of the present disclosure, the positioning of a positive spalling layer 136 in physical contact with and adjacent to a negative spalling layer 137 may create a weakness at their interface at which a fracture may occur when a force is applied to the stack 100. Thus, referring to FIG. 1B, there are a total of six possible fracture planes (138, 138A', 138B, 138B', 138C, and 138C') such that when a force is applied, spalling may be occur at one or more of these fracture planes 138. In some embodiments of the present disclosure, spalling may occur as some other plane that does not correspond to the interface of a positive spalling layer 136 with a negative spalling layer 137. In some embodiments of the present disclosure, spalling may occur at partially or completely at one or more planes within a spalling layer 130.

In some embodiments of the present disclosure, a spalling layer may be constructed of one or more spalling triplets 132, each containing a positive spalling layer 136 constructed of GaInAs (providing a compressive stress) positioned between two negative spalling layers 137 constructed of GaAsP, where each of these three layers have a thickness between about 2 nm and about 20 nm, or between about 6 nm and about 10 nm.

Figure 2:
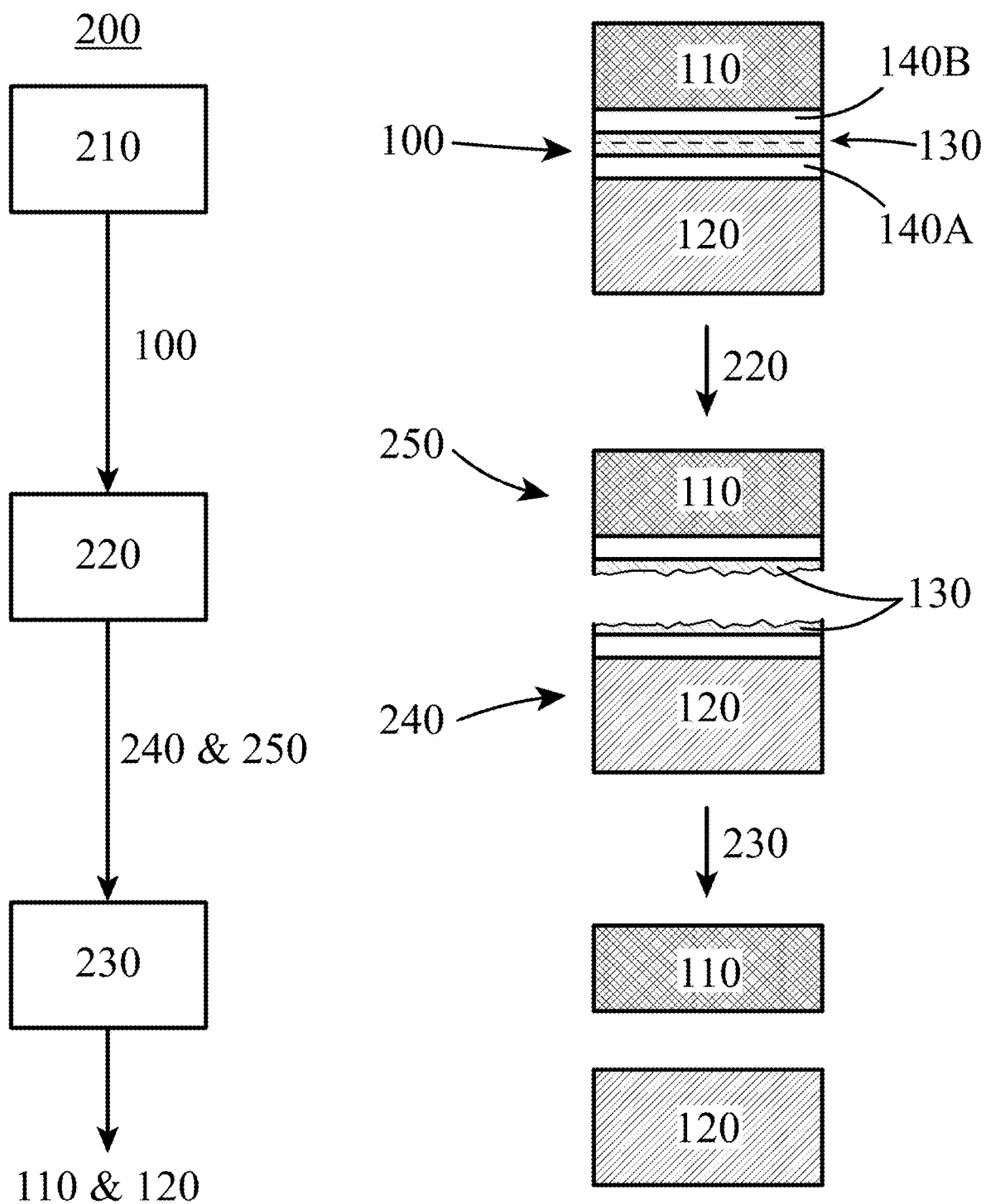
FIG. 2 illustrates a method for making a device like those illustrated in FIGS. 1A and 1B, according to some embodiments of the present disclosure.

FIGS. 1A and 1B illustrate the growth direction of the exemplary stacks 100 shown. FIG. 2 illustrates an exemplary method 200 for creating the stack 100 and for processing the stack 100 to produce the final targeted products; the device 110 and the recovered substrate 120. Such a method, as shown in FIG. 2, may begin with the depositing 210 of the various layers included in the stack 100. In some embodiments of the present disclosure, the depositing 210 may include, in order, depositing a first temporary layer 140A onto a substrate 120, followed by depositing a spalling layer 130 onto the first temporary layer 140A. As shown in FIG. 1B, a spalling layer 130 may be constructed of one or more spalling triplets 132, each constructed of a positive spalling layer 136 positioned between two negative spalling layer 137. The method 200 may then continue with the depositing a second temporary layer 140B onto the spalling layer 130, and followed by depositing an device 110 (e.g., including a III-V material) onto the second temporary layer 140B, resulting in the forming of the stack 100. These depositing steps may be performed by at least one of metalorganic vapor phase epitaxy, molecular beam epitaxy, hydride vapor phase epitaxy, chemical beam epitaxy and/or liquid phase epitaxy.

Once the stack 100 has been manufactured, the method 200 shown in FIG. 2 may proceed with dividing 200 (i.e., spalling) the stack 100 substantially at a plane positioned only within the spalling layer 130, e.g., substantially along the dashed line, to form a first portion 240 that includes the substrate 120 and the first temporary layer 140A and a second portion 250 that includes the device 110 and the second temporary layer 140B. As indicated in FIG. 2, the first portion 240 of the stack 100 may also include a portion of the original spalling layer 130, for example a portion of the first layer 130A of the spalling layer 130 shown in FIG. 1. Similarly, the second portion 250 of the stack 100 may also include a portion of the original spalling layer 130; e.g., a portion of the second layer 130B of the spalling layer 130 shown in FIG. 1. In FIG. 2, these two parts of the original spalling layer 130 are shown as being substantially similar in thickness. This is for illustrative purposes only, and in some embodiments of the present disclosure, the first portion 240 and the second portion 250 of the stack 100 may have equal or different amounts of the original spalling layer 130. In some embodiments of the present disclosure, the dividing 220 may be performed by exposing the stack 100 to a method that includes at least one a mechanical force, and/or by the inducing of a stress by means of a deposited strained metal and/or other externally deposited stressor.

Referring again to FIG. 2, the exemplary method 200 may continue with the removing 230 of any remaining spalling layer 130 and the first temporary 140A layer from the first portion 240 of the stack 100, resulting in the recovery of the substrate 120 substantially free of the spalling layer 130 and the first temporary layer 140A. Similarly, the removing 230 may also include the removing of any remaining spalling layer 130 and the second temporary layer 140B from the second portion 250 of the stack, resulting in the device 110 substantially free of the spalling layer 130 and the second temporary layer 140B. As described above, the removing 230 of the temporary layers, 140A and 140B, and residual material from the spalling layer 130 may be accomplished using a suitable chemical etchant. For example, the remainder of the spalling layer 130 and the GaAs portion of the temporary layers 140 may be etched away with phosphoric acid:hydrogen peroxide:water (3:4:1 by volume), and the GaInP portion of the temporary layers 140 may be etched away with concentrated hydrochloric acid.

In some embodiments of the present disclosure, as described above, a spalling layer 130 in which the fracture is to occur may be grown, followed by the material used to manufacture the device 110. Subsequently, after the dividing 220 step is completed, any remaining material from the spalling layer 130 and/or temporary layer 140B, may be etched away and another growth enabled on the original, recovered substrate 120.

Causing a physical crack to form at some position on the side of a stack 100 is difficult, because of the small (sub-mm) length scales involved. Engineering a weak layer, e.g., spalling layer 130 as described herein, within the stack 100 is a promising solution, as the atomic bonds within the weak layer may preferentially break. As described herein, spalling directed to a specific location within a stack 100 may be achieved by engineering a weak spalling layer 130 constructed of a plurality of pairs of strain-balanced layers (130A and 130B), e.g., GaInAs/GaAsP and/or GaInAs/GaInP, positioned between the device 110 and the substrate 120. As shown in FIG. 1B, a spalling layer 130 may be constructed of one or more spalling triplets 132, each constructed of a positive spalling layer 136 positioned between two negative spalling layer 137. In this example, a GaInAs layer provides a compressive stress and is the positive spalling layer 136 and a GaAsP layer provides a tensile stress and is the negative spalling layer 137. Each triplet 132, therefore, contains two GaAsP/GaInAs interfaces, each providing a possible fracture plane 138 within the spalling layer 130. As an example, $Ga_{0.89}In_{0.11}As$ has a lattice mismatch of about −0.73% relative to a GaAs substrate and can be grown coherently (i.e., with the same in-plane crystallographic lattice-constant but possibly a strained out-of-plane lattice constant) up to about 100 nm, with a coherent compressive stress of about 870 MPa. Similarly, $GaAs_{0.9}P_{0.1}$ has a lattice mismatch of about +0.35% and can be grown coherently up to about 250 nm, with a coherent tensile stress of about −440 MPa. These stresses can be effective in creating a weak point in the spalling layer 130 resulting in a facture to occur at that location.

Figure 3:
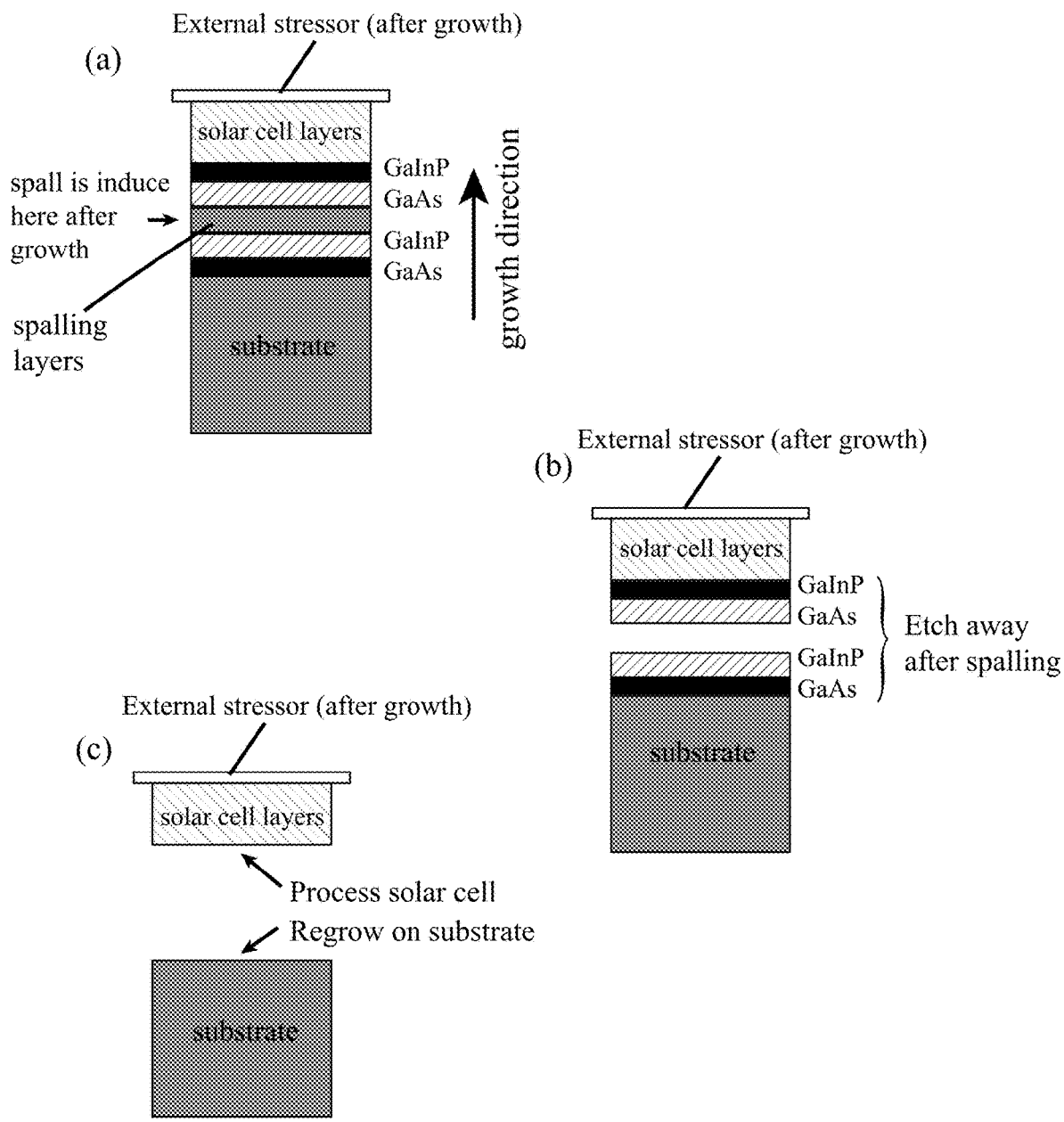
FIG. 3 illustrates various aspects of the current disclosure, according to some embodiments of the present disclosure. Panel (a) illustrates the growth of a stack. Two GaInP stop etch layers (i.e., temporary layers) are included, as well as a spalling layer made of multiple strain-balanced layer pairs. After growth, an external stressor induces fracture in the weak strain-balanced layers and the material on top is spalled off (e.g., including the solar cell layers), leaving the two halves shown in Panel (b). In Panel (c), the remaining strain-balanced layers, GaAs and GaInP layers on either side are chemically etched away, leaving a solar cell and the original substrate.

In some embodiments of the present disclosure, these two materials can be grown as alternating layers (i.e., pairs), with the GaAsP approximately twice as thick as the GaInAs, to create a superlattice with a net average stress near zero. The inventors of the present disclosure have demonstrated solar cells with greater than 50 pairs of layers, constructed of compressive GaInAs layers having a thickness of about 8.5 nm each and tensile GaAsP layers having a thickness of about 17.5 nm each. In this way, the local stress is high enabling spalling to occur, while maintaining the average stress to a very low value, enabling high quality epitaxial layers to be deposited thereon. Because the strain-balanced superlattice is grown epitaxially, no additional treatments are required to create a weak layer. FIG. 3 provides another representation of devices and methods described herein.

Examples

Example 1. A method comprising: depositing a spalling layer onto a surface comprising a substrate; depositing a device comprising a III-V material onto the spalling layer, resulting in the forming of a stack; and dividing the stack substantially at a plane positioned within the spalling layer to form a first portion comprising the substrate and a second portion comprising the PV device, wherein: the spalling layer comprises a first layer configured to provide a compressive stress and a second layer configured to provide a tensile stress, the first layer and the second layer form an interface, the dividing occurs as result of the interface, and the compressive stress and the tensile stress are strain-balanced so that a total strain within the spalling layer is approximately zero.

Example 2. The method of Example 1, wherein the dividing is performed by exposing the full stack to a method comprising at least one of a stress or a force.

Example 3. The method of either Example 1 or Example 2, wherein the force comprises a mechanical force.

Example 4. The method of at least one of Examples 1-3, wherein the stress is induced by depositing a strained material on the stack.

Example 5. The method of at least one of Examples 1-4, wherein the compressive stress is between about zero MPa and about 1000 MPa.

Example 6. The method of at least one of Examples 1-5, wherein the compressive stress is between about zero MPa and about 300 MPa.

Example 7. The method of at least one of Examples 1-6, wherein the tensile stress is between about −1000 MPa and about zero MPa.

Example 8. The method of at least one of Examples 1-7, wherein the tensile stress is between about −300 MPa and about zero MPa.

Example 9. The method of at least one of Examples 1-8, wherein: the first layer and the second layer form a first pair of layers, the stack comprises a plurality of pairs of layers, and the pairs are positioned in sequence and adjacent to neighboring pairs.

Example 10. The method of at least one of Examples 1-9, wherein a number of pairs is between 2 and 20, inclusively.

Example 11. The method of at least one of Examples 1-10, wherein: each pair further comprises a third layer configured to provide a tensile stress, and the first layer is positioned between the second layer and the third layer, resulting in a triplet of layers.

Example 12. The method of at least one of Examples 1-11, wherein the first layer comprises at least one of GaInAs or GaInAsP.

Example 13. The method of at least one of Examples 1-12, wherein the second layer comprises at least one of GaAsP, GaInP, or GaP.

Example 14. The method of at least one of Examples 1-13, wherein the third layer comprises at least one of GaAsP, GaInP, or GaP.

Example 15. The method of at least one of Examples 1-14, wherein the first layer has a thickness between 2 nm and 20 nm.

Example 16. The method of at least one of Examples 1-15, wherein the second layer has a thickness between 2 nm and 20 nm.

Example 17. The method of at least one of Examples 1-16, wherein the third layer has a thickness between 2 nm and 20 nm.

Example 18. The method of at least one of Examples 1-17, wherein the depositing of the spalling layer is performed by a method comprising at least one of metalorganic vapor phase epitaxy, molecular beam epitaxy, hydride vapor phase epitaxy, chemical beam epitaxy, or liquid phase epitaxy.

Example 19. The method of at least one of Examples 1-18, wherein the depositing of the device is performed by a method comprising at least one of metalorganic vapor phase epitaxy, molecular beam epitaxy, hydride vapor phase epitaxy, chemical beam epitaxy, or liquid phase epitaxy.

Example 20. The method of at least one of Examples 1-19, wherein: the first portion further comprises at least some of the spalling layer, and the second portion further comprises at least some of the spalling layer.

Example 21. The method of at least one of Examples 1-20, further comprising, after the dividing: removing any remaining spalling layer from the first portion, and removing any remaining spalling layer from the second portion.

Example 22. The method of at least one of Examples 1-21, wherein the removing is performed using a chemical etchant.

Example 23. The method of at least one of Examples 1-22, further comprising, prior to the depositing of the spalling layer, depositing a first temporary layer onto the substrate.

Example 24. The method of at least one of Examples 1-23, further comprising, after the depositing of the spalling layer, depositing a second temporary layer onto the spalling layer.

Example 25. The method of at least one of Examples 1-24, wherein the first temporary layer comprises a first removable layer comprising GaInP, and the first removable layer is positioned between the substrate and the spalling layer.

Example 26. The method of at least one of Examples 1-25, wherein the first temporary layer further comprises a second removable layer comprising GaAs, and the second removable layer is positioned between the first removable layer and the spalling layer.

Example 27. The method of at least one of Examples 1-26, wherein the second temporary layer comprises a third removable layer comprising GaInP, and the third removable layer is positioned between the PV device and the spalling layer.

Example 28. The method of at least one of Examples 1-27, wherein: the second temporary layer further comprises a fourth removable layer comprising GaAs, and the fourth removable layer is positioned between the third removable layer and the spalling layer.

Example 29. The method of at least one of Examples 1-28, wherein the first removable layer and the second removable layer each have a thickness between about 0.1 μm and about 1 μm.

Example 30. The method of at least one of Examples 1-29, wherein the third removable layer and the fourth removable layer each have a thickness between about 0.1 μm and about 1 μm.

Example 31. The method of at least one of Examples 1-30, further comprising after the dividing: a removing of the first temporary layer; and a removing of the second temporary layer.

Example 32. The method of at least one of Examples 1-31, wherein the removing of the first temporary layer and the removing of the second temporary layer is performed using a chemical etchant.

Example 33. A device comprising, in order: a substrate; a first temporary layer; a spalling layer; a second temporary; and a semiconductor-containing device.

Example 34. The device of Example 33, wherein the semiconductor-containing device comprises at least one of a photovoltaic device, a light-emitting diode, a detector or sensor, or a display.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A method comprising:
depositing a spalling layer comprising a spalling triplet onto a substrate;
depositing a device comprising a III-V material onto the spalling layer, resulting in the forming of a stack; and
dividing the stack substantially at a plane positioned within the spalling layer to form a first portion comprising the substrate and a second portion comprising the device, wherein:
the spalling triplet comprises a first layer configured to provide a compressive stress, a second layer configured to provide a first tensile stress, and a third layer configured to provide a second tensile stress,
the first layer is positioned between the second layer and the third layer,
at least one of the first layer, the second layer, and the third layer form an interface,
the dividing at the plane occurs as result of the interface, and
the compressive stress, the first tensile stress, and the second tensile stress are strain-balanced so that a total strain within the spalling layer is approximately zero.

2. The method of claim 1, wherein the dividing is performed by exposing the full stack to at least one of a stress or a force.

3. The method of claim 2, wherein the force comprises a mechanical force.

4. The method of claim 2, wherein the stress is induced by depositing a strained material on the stack.

5. The method of claim 1, wherein the compressive stress is between about zero MPa and about 1000 MPa.

6. The method of claim 5, wherein the compressive stress is between about zero MPa and about 300 MPa.

7. The method of claim 1, wherein at least one of the first tensile stress or the second tensile stress is between about −1000 MPa and about zero MPa.

8. The method of claim 7, wherein at least one of the first tensile stress or the second tensile stress is between about −300 MPa and about zero MPa.

9. The method of claim 1, wherein the spalling layer comprises between 2 and 20 spalling triplets, inclusively.

10. The method of claim 9, wherein
the spalling triplets are positioned in sequence and adjacent to neighboring spalling triplets.

11. The method of claim 1, wherein the first layer comprises at least one of GaInAs or GaInAsP.

12. The method of claim 1, wherein the second layer comprises at least one of GaAsP, GaInP, or GaP.

13. The method of claim 1, wherein the third layer comprises at least one of GaAsP, GaInP, or GaP.

14. The method of claim 1, wherein the first layer has a thickness between 2 nm and 20 nm.

15. The method of claim 1, wherein the second layer has a thickness between 2 nm and 20 nm.

16. The method of claim 1, wherein the third layer has a thickness between 2 nm and 20 nm.

17. The method of claim 1, wherein the depositing of the spalling layer is performed by a method comprising at least one of metalorganic vapor phase epitaxy, molecular beam epitaxy, hydride vapor phase epitaxy, chemical beam epitaxy, or liquid phase epitaxy.

18. The method of claim 1, further comprising, prior to the depositing of the spalling layer, depositing a first temporary layer comprising GaInP onto the substrate.

19. The method of claim 18, further comprising, after the depositing of the spalling layer, depositing a second temporary layer comprising GaInP onto the spalling layer.

20. The method of claim 1, wherein, after the dividing, the first portion includes at least some of the spalling layer and the second portion includes at least some of the spalling layer.

* * * * *